(12) United States Patent
Wang

(10) Patent No.: US 6,219,251 B1
(45) Date of Patent: Apr. 17, 2001

(54) UNIVERSAL RETENTION MODULE

(75) Inventor: Pei-Rong Wang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/386,080

(22) Filed: Aug. 30, 1999

(30) Foreign Application Priority Data

Oct. 23, 1998  (TW) .................................................. 87217620

(51) Int. Cl.[7] ....................................................... H05K 7/20
(52) U.S. Cl. .......................... 361/752; 361/753; 361/704; 361/710; 439/377
(58) Field of Search ..................................... 361/752, 754, 361/759, 753, 801, 802, 728–730, 704, 707, 710, 715; 439/377

(56) References Cited

U.S. PATENT DOCUMENTS

| | | | |
|---|---|---|---|
| 5,483,422 | * | 1/1996 | Bowen et al. ........................ 361/802 |
| 5,726,865 | * | 3/1998 | Webb et al. .......................... 361/801 |
| 5,829,601 | * | 11/1998 | Yurchenco et al. .................. 361/754 |
| 5,856,910 | * | 1/1999 | Yurchenco et al. .................. 361/704 |
| 6,064,574 | * | 5/2000 | Yu et al. ............................... 361/704 |

* cited by examiner

*Primary Examiner*—Leo P. Picard
*Assistant Examiner*—Hung Van Duong
(74) *Attorney, Agent, or Firm*—Wei Te Chung

(57) ABSTRACT

A retention module comprises a U-shaped bracket and a pair of retention mechanisms. The bracket includes a base portion and a pair of support portions formed at opposite ends of the base portion. The base portion defines a main slot for snugly receiving an elongate connector. Each support portion includes a lateral wall and a pair of retention walls inwardly extending from opposite edges of the lateral wall. An elongate notch is defined in each lateral wall and exposed to a top thereof. Each retention mechanism includes a body and a pair of ears. The ears are adapted to engage with the notches of the bracket thereby retaining the retention mechanism thereto. A groove is defined in a surface of the body and exposed to a bottom thereof for securing an upper corner of the CPU.

11 Claims, 6 Drawing Sheets

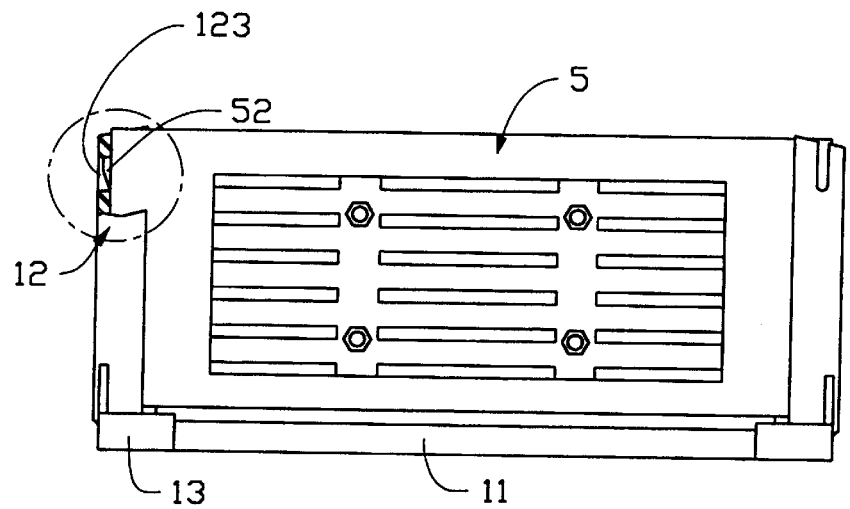
FIG. 5A
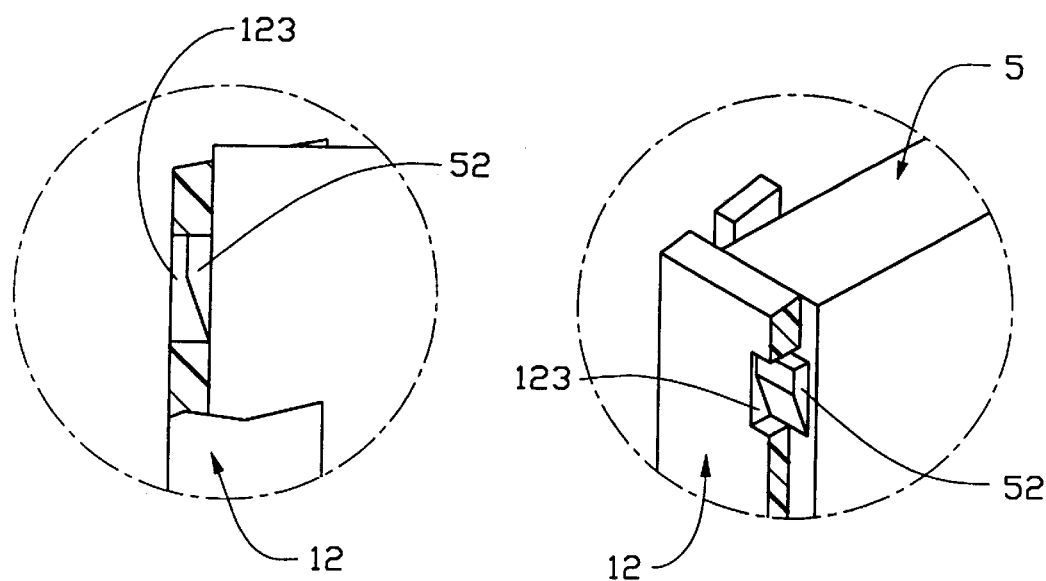
FIG. 5B
FIG. 5C

UNIVERSAL RETENTION MODULE

BACKGROUND OF THE INVENTION

The present invention relates to a retention module for supporting and receiving a CPU, and especially to a retention module adaptable for use with a variety of different types of CPUs.

A retention module is commonly disposed on a mother board to vertically support and receive a CPU. Such a vertical structure promotes an efficient layout of other electrical devices on the mother board.

Two types of CPUs are commonly used in many computer systems. FIG. 1 shows a conventional retention module 77 made of plastic and adapted to support and receive one type of CPU 5. The retention module 77 has a U-shaped structure including a base portion 71 and a pair of support portions 72 formed at opposite ends of the base portion 71. The base portion 71 defines a main slot 74 for snugly receiving an elongate connector 3. Each support portion 72 includes a lateral wall 721 and a pair of retention walls 722 inwardly extending from opposite edges of the lateral wall 721. The lateral wall 721 and the retention walls 722 cooperate to define a lateral slot 75 dimensioned to retain a lateral edge of the CPU 5 thereby preventing the CPU 5 from deflection. An opening 723 is defined in each lateral wall 72. The retention module 77 further includes a pair of standoffs 73 arranged proximate each end of the base portion 71. An aperture 76 is defined through each standoff 73. A rivet 731 extends through the aperture 76 of each standoff 73 thereby securing the retention module 77 to a circuit board (not shown). An ear 52 outwardly projects from each lateral edge of the CPU 5 corresponding to the opening 723 of the support portion 72 for engaging with the opening 723 thereby retaining the CPU 5 in the retention module 77.

FIG. 2 shows another pair of conventional retention mechanisms 6 made of plastic and adapted to support and receive the other type CPU 51. The thickness of the CPU 51 is smaller than the thickness of the CPU 5 thus the retention module 77 shown in FIG. 1 cannot be used with the CPU 51 shown in FIG. 2. Each retention mechanism 6 includes a rear plate 60, a pair of standoffs 63 inwardly extending from a lower edge of the rear plate 60, and a pair of retention portions 61 formed on the rear plate 60 and defining a gap 62 therebetween. A latching post 64 downwardly extends from a bottom surface of each standoff 63 for securing the retention mechanism 6 to a circuit board (not shown). An elongate connector 3 is arranged between the retention mechanisms 6 and adapted to receive the CPU 51. Each standoff 6 is adapted to secure one end of the connector 3 therebetween for securing the connector 3 at a predetermined position on the circuit board. When the CPU 51 is inserted into the connector 3, a lateral edge of the CPU 51 is received in the gap 62 between the retention portions 61 thereby preventing the CPU 51 from deflection. However, the CPU 51 is likely to be pulled out of the connector 3 since the retention mechanisms 6 can not prevent vertical displacement of the CPU 51.

The retention module 77 and the retention mechanism 6 can not be used in place of each other. Thus, different means are required to support different types of CPUs thereby increasing costs. Hence, it is readily apparent that a retention module adapted to support and receive different types of CPUs is desirable.

SUMMARY OF THE INVENTION

Accordingly, the primary object of the present invention is to provide a retention module adaptable for use with a variety of different types of CPUs.

Another object of the present invention is to provide a retention module which is easily assembled.

To fulfill the above-mentioned objects, a retention module of the present invention comprises a U-shaped bracket and a pair of retention mechanisms. The bracket includes a base portion and a pair of support portions formed at opposite ends of the base portion. The base portion defines a main slot for snugly receiving an elongate connector. Each support portion includes a lateral wall and a pair of retention walls inwardly extending from opposite edges of the lateral wall. The lateral wall and the retention walls cooperate to define a lateral slot dimensioned to retain a side of the CPU thereby preventing the CPU from deflection. An elongate notch is defined in each lateral wall and exposed to a top thereof.

Each retention mechanism includes a body and a pair of ears. The ears are adapted to engage with the notches of the bracket thereby retaining the retention mechanism in the bracket. A groove is defined in a surface of the body and exposed to a bottom surface thereof for securing an upper corner of the CPU. Thus, the bracket of the retention module can individually receive and support one type of CPU. When the retention mechanism is assembled to the bracket, the retention module can receive and support another type of CPU.

Other objects, advantages and novel features of the invention will become more apparent from the following detailed description when taken in conjunction with the accompanying drawings.

BRIEF DESCRIPTION OF THE DRAWINGS

FIG. 5A is a side planar and partial cross-sectional view of a bracket of the retention module with a CPU retained therein;

FIG. 5B is a partially enlarged view of FIG. 5A;

FIG. 5C is a view similar to FIG. 5B but taken from a different perspective;

DETAILED DESCRIPTION OF A PREFERRED EMBODIMENT

Figure 1:
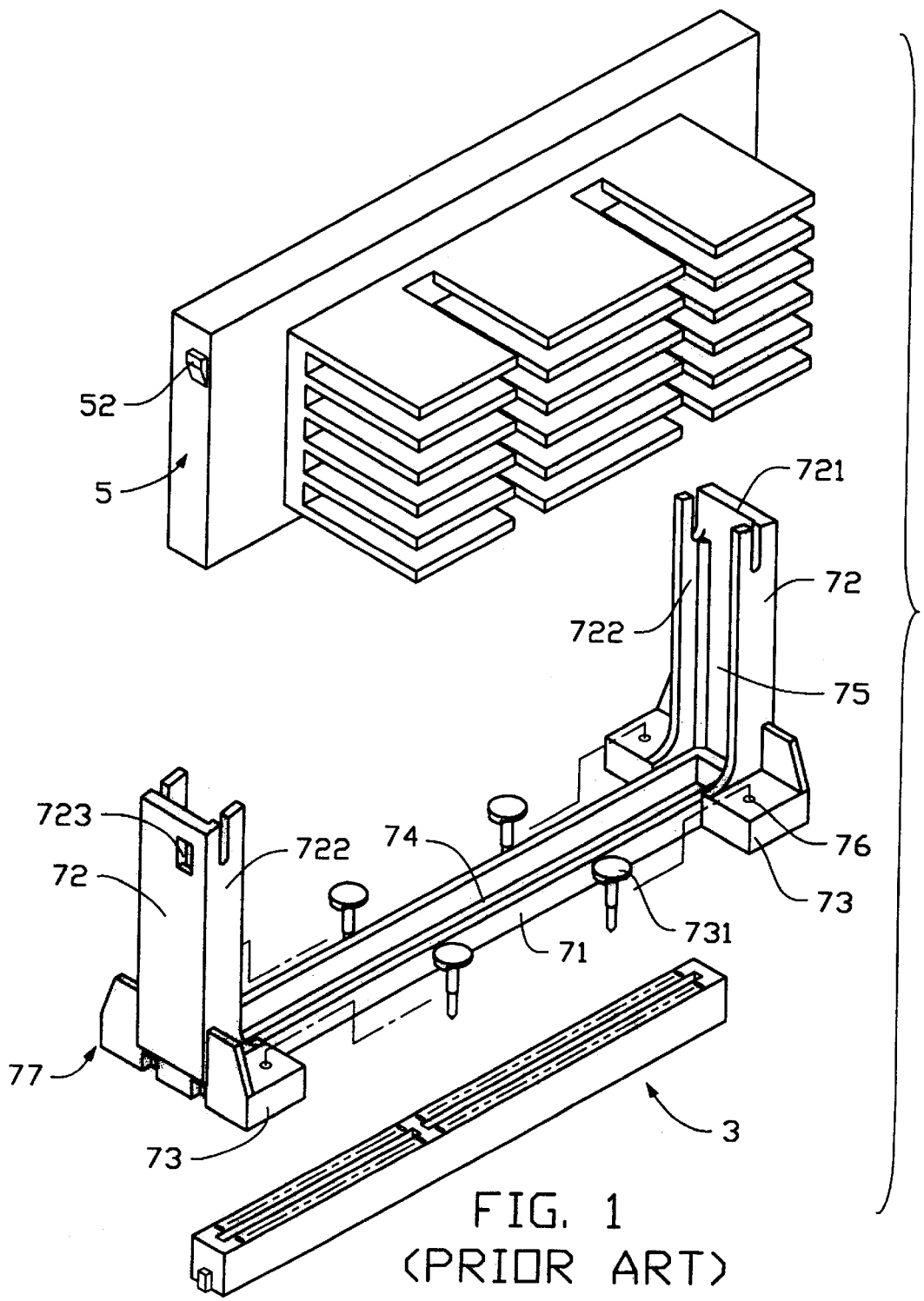
FIG. 1 is an exploded view of a conventional retention module and a CPU.
Figure 2:
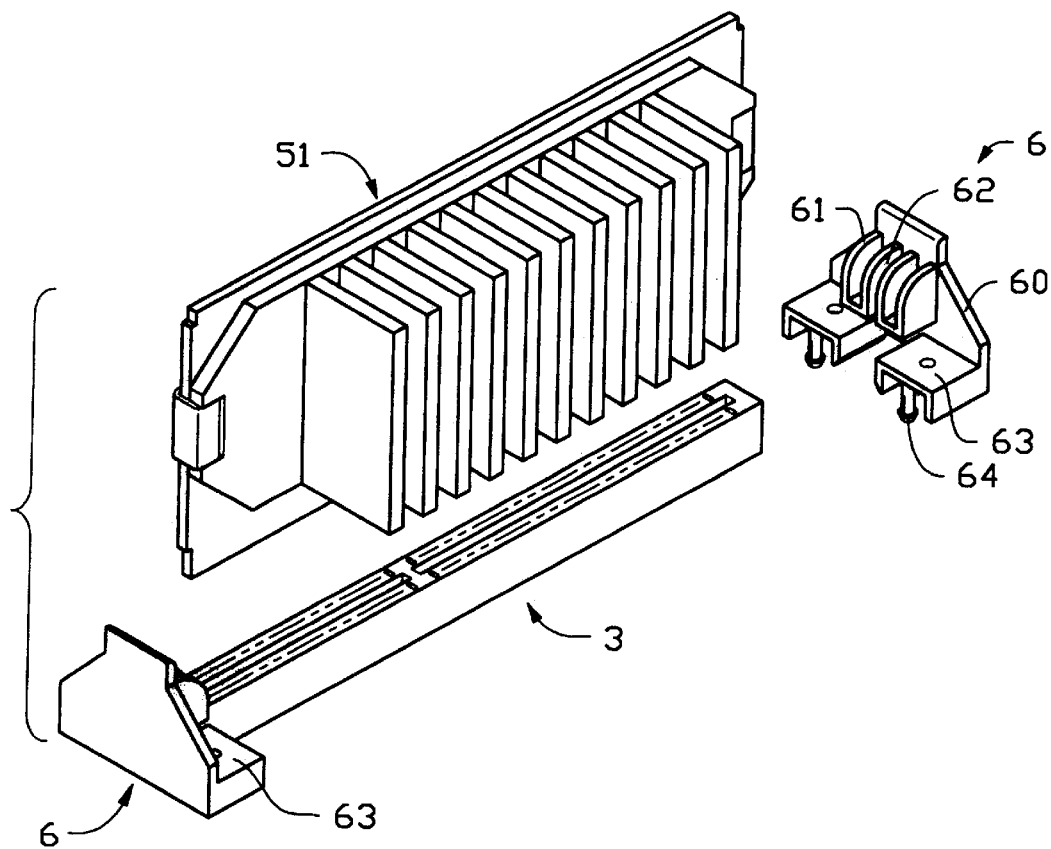
FIG. 2 is an exploded view of a pair of conventional retention mechanisms and a CPU.
Figure 3:
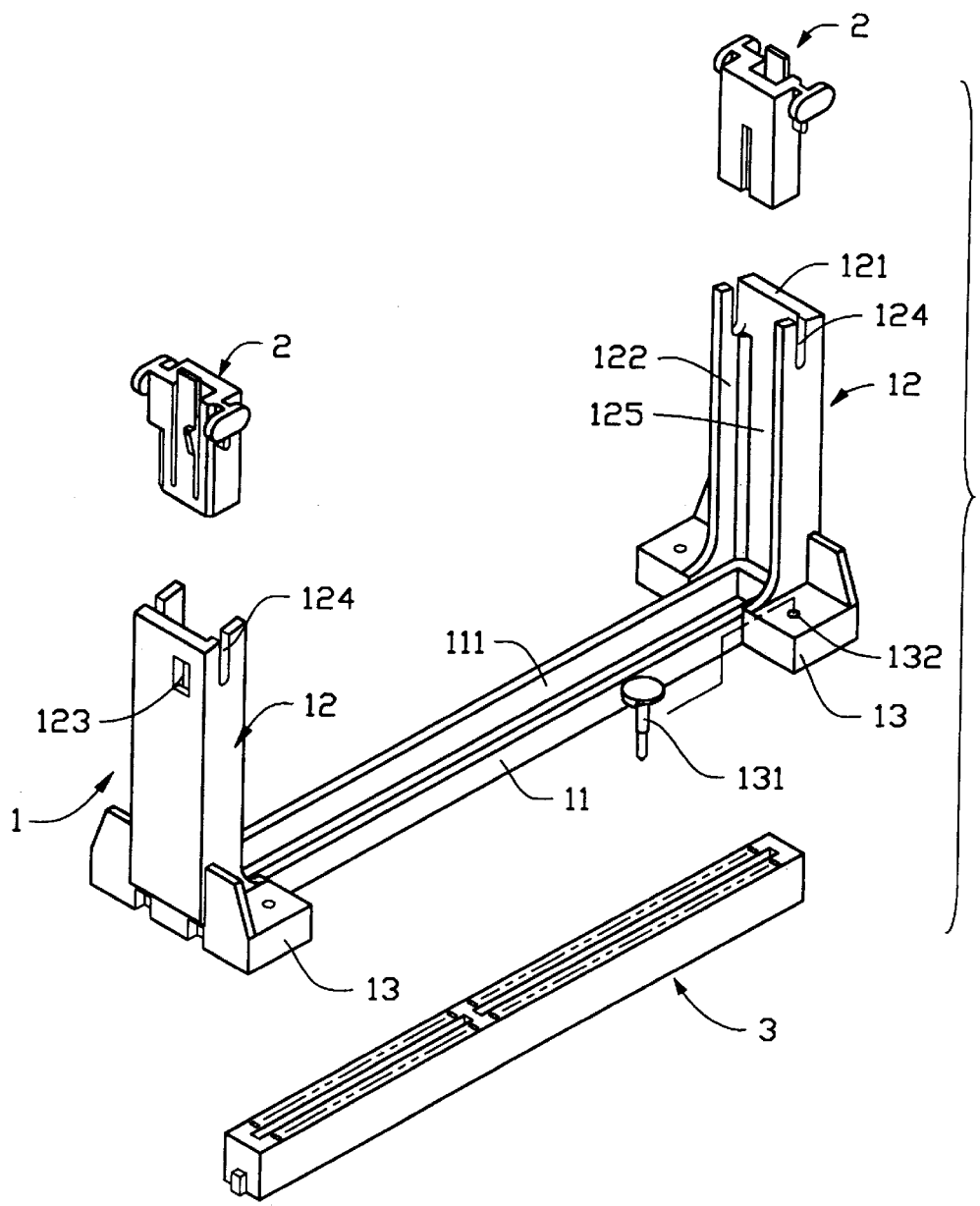
FIG. 3 is an exploded view of a retention module in accordance with the present invention.

Referring to FIGS. 3, 5A, 5B and 5C, a retention module of the present invention comprises a U-shaped bracket 1 and a pair of retention mechanisms 2. The bracket 1 includes a base portion 11 and a pair of support portions 12 formed at opposite ends of the base portion 11. The base portion 11 defines a main slot 111 dimensioned to snugly receive an elongate connector 3. Each support portion 12 includes a lateral wall 121 and a pair of retention walls 122 inwardly extending from opposite edges of the lateral wall 121. The lateral wall 121 and the retention walls 122 cooperate to define a lateral slot 125 dimensioned to retain a lateral edge of a CPU 5 thereby preventing deflection thereof. An elongate notch 124 is defined in each retention wall 122 and exposed to a top thereof. An opening 123 is defined in each lateral wall 121 offset from a central line thereof for engaging with an outwardly projecting ear 52 formed on a lateral edge of the CPU 5 thereby providing the retention module 1 with an anti-disorientation function and preventing outward and vertical displacement of the CPU 5. The retention module 1 further includes a pair of standoffs 13 arranged at each one end of the base portion 11. An aperture 132 is defined through each standoff 13. A rivet 131 extends through the aperture 132 of each standoff 13 thereby securing the retention module 1 to a circuit board (not shown).

Figure 4A:
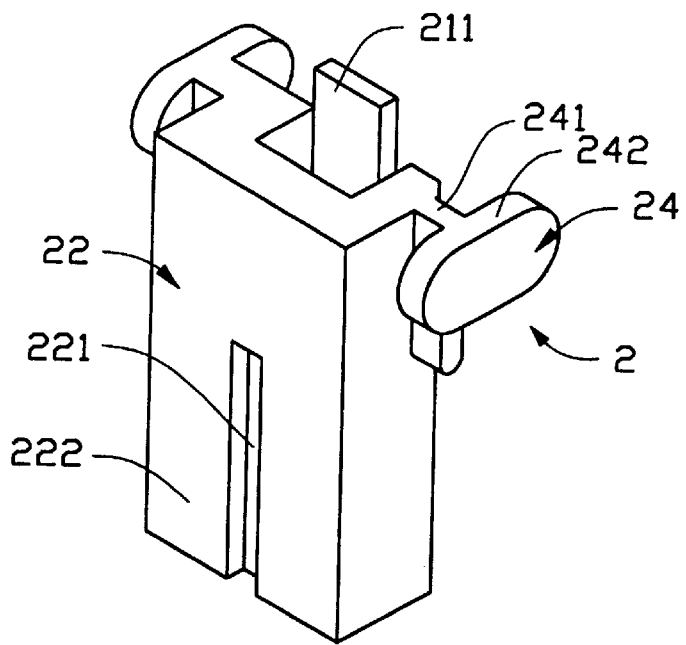
FIG. 4A is a perspective view of a retention mechanism of the retention module of the present invention.
Figure 4B:
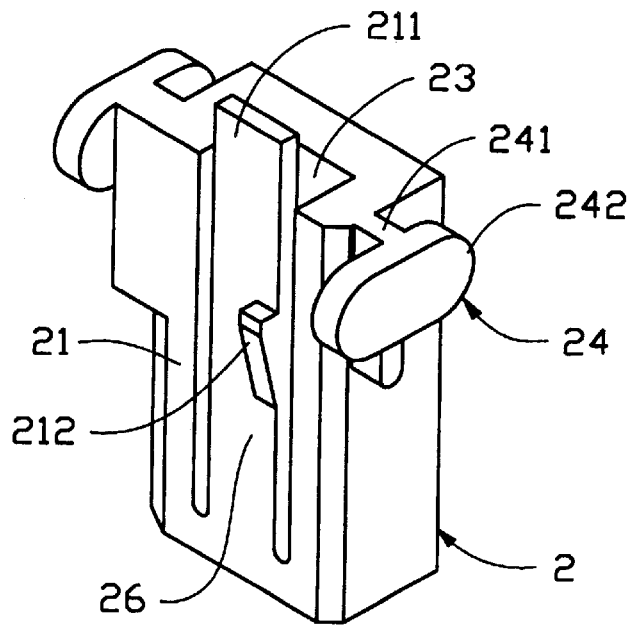
FIG. 4B is a view similar to FIG. 4A but taken from a different perspective.

Also referring to FIGS. 4A and 4B, each retention mechanism 2 includes a body 22 and a pair of ears 24 outwardly extending from opposite edges of the body 22. Each ear 24 has a narrow linking portion 241 and a wide gripping portion 242. The retention mechanism 2 has a securing surface 21.and a contact surface 222 opposite the securing surface 21. An elongate recess 23 is defined in the securing surface 21. An elongate strip 26 formed in the body and extending into the recess 23 includes a free end 211 received in the recess 23 and a projection 212 formed on the strip 26 offset from a central line of the body 22 and corresponding to the opening 123 of the bracket 1. The free end 211 of the strip 26 is distanced from a bottom of the recess 23 thereby providing clearance for movement of the free end 211. The ears 24 are adapted to be assembled to the bracket 1 with the linking portions 241 thereof engaging in the notches 124 thereby arranging the retention walls 122 between the body 22 and the gripping portion 242 of the retention mechanism 2. A groove 221 is defined in the contact surface 222 of the body 22 and exposed to a bottom surface thereof.

Figure 6A:
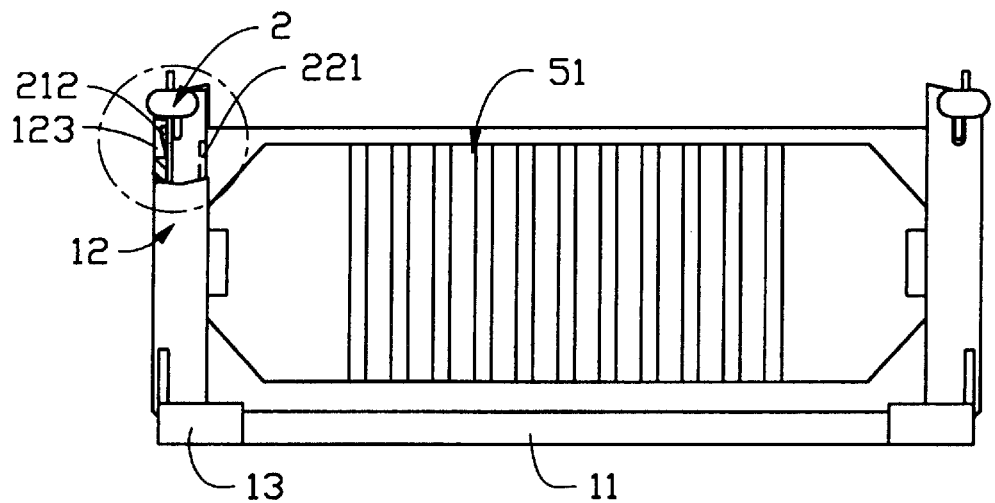
FIG. 6A is a side planar and partial cross-sectional view of the retention module with a CPU retained therein.
Figure 6B:
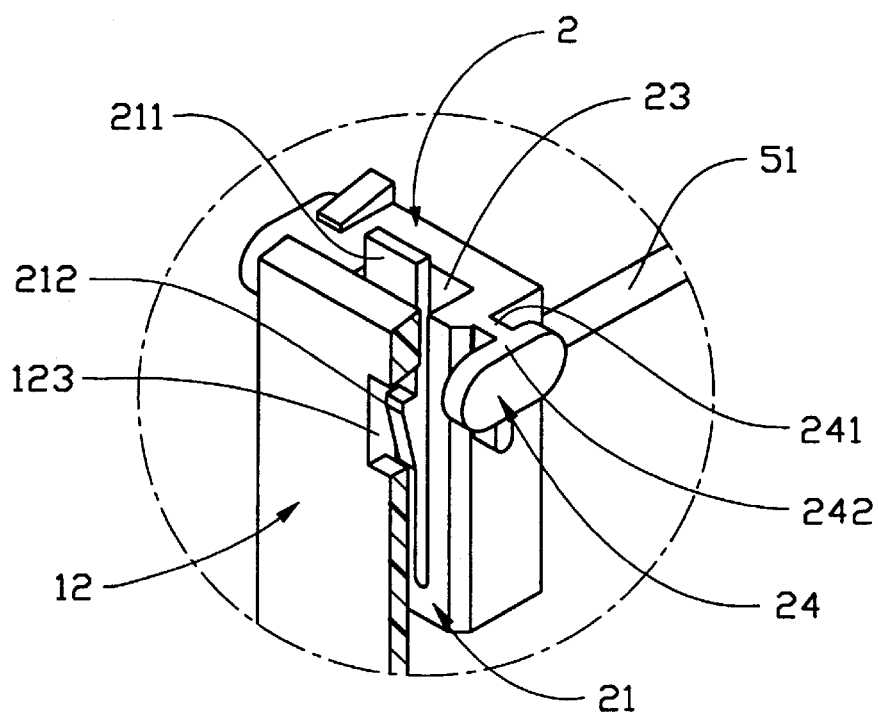
FIG. 6B is a partially enlarged view of FIG. 6A taken from a different perspective.

Also referring to FIGS. 6A and 6B, the thickness of the CPU 51 inserted into the connector 3 in the bracket 1 is smaller than the thickness of the CPU 5. The retention mechanism 2 is mounted to the support portion 12 of the bracket 1 with the projection 212 of the retention mechanism 2 engaging with the opening 123 of the bracket 1 thereby securing the retention mechanism 2 thereto. The groove 221 of the retention mechanism 2 receives an upper corner of the CPU 51 thereby preventing the CPU 51 from deflection and outward and vertical displacement.

Such a retention module can be used with the CPU 5, the CPU 51, and may other different types of CPUs as long as the grooves 221 of the retention mechanism are dimensioned to receive a lateral edge of the CPU.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A retention module mounted on a circuit board for supporting a CPU, the retention module comprising:
    a U-shaped bracket including a base portion and a pair of support portions formed on opposite ends of the base portion, respectively; and
    a pair of retention mechanisms each including a body latchably engaged with the support portion of the bracket to retain the retention mechanism to the bracket, the body having a contact surface and a securing surface opposite the contact surface, a groove being defined in the contact surface of the body for engaging and fixing the CPU, an elongate recess being defined in the securing surface and an elongate strip being formed in the body and extending into the recess, the strip being distanced from a bottom of the recess thereby providing clearance for movement of the strip.

2. The retention module as claimed in claim 1, wherein each support portion includes a lateral wall and a pair of retention walls inwardly extending from opposite edges of the lateral wall, the lateral wall and the retention walls cooperating to define a lateral slot dimensioned to receive a lateral edge of the CPU thereby preventing the CPU from deflection.

3. The retention module as claimed in claim 1, wherein a projection is formed on the strip of the body and offset from a central line of the body, an opening being defined through the lateral wall of the bracket and offset from a central line thereof corresponding to the projection of the retention mechanism thereby providing an anti-disorientation function and preventing the CPU from outward and vertical displacement.

4. The retention module as claimed in claim 1, wherein the groove is defined in the contact surface of the body and exposed to a bottom surface thereof for securing an upper corner of the CPU.

5. The retention module as claimed in claim 1, further including a pair of standoffs arranged at each end of the base portion, an aperture being defined through each standoff, a rivet extending through the aperture of each standoff thereby securing the retention module to a circuit board.

6. The retention module as claimed in claim 2, wherein the retention mechanism further includes an ear received and supported by an elongate notch defined in the retention wall of one of the support portions.

7. The retention module as claimed in claim 3, wherein the ear of the retention mechanism includes a narrow linking portion for engaging in the notch of the bracket and a wide gripping portion, the linking portion and the gripping portion being adapted to secure the retention mechanism to the bracket.

8. An electrical assembly comprising:
    a U-shaped bracket defining pair of vertically extending support portions opposite to each other, each of said support portions including a pair of retention walls defining a pair of elongate notches therein, and a lateral wall defining a latching opening therein;
    a pair of retention mechanisms respectively received within each of said support portions, each of said retention mechanism including a projection latchable engagement within the latching opening and an elongated vertical groove; and
    either a thin first CPU module or a thick second CPU module mutually exclusively retained in said bracket; wherein
    said first CPU module is dimensioned with a first thickness in compliance with the groove so as to be retained within the groove with an upper edge thereof being pressed by the retention mechanism for preventing upward movement from the retention module, while said second CPU module is dimensioned with a second thickness in compliance with a distance between said retention walls of each of said retention mechanisms so as to be retained within the corresponding retention mechanism with a projection ear latchably engaged within the corresponding latching opening under a condition that the corresponding retention mechanism has been removed from the support portion of the bracket.

9. Retention mechanism for use with a bracket receiving a thinner CPU module instead of a thicker CPU module which is adapted to be received within the bracket without said retention mechanism thereof, wherein said bracket including a lateral wall and a pair of retention walls respectively defining a latching opening and a pair of elongated notches therein, said retention mechanism comprising:

a body defining a projection on a first side for latchable engagement within said latching opening and a vertically extending groove in a second side opposite to said first side for latchable engagement with the thinner CPU module; and a pair of ears defining a pair of linking portions respectively on a third and an opposite fourth side for receivable engagement within the corresponding notches, respectively, wherein said first, second, third and fourth sides commonly define generally a rectangle.

10. A retention module comprising:

a U-shaped bracket defining pair of vertically extending support portions opposite to each other, each of said support portions including a pair of retention walls defining a pair of elongate notches therein, and a lateral wall defining a latching opening therein;

a pair of retention mechanisms respectively received within each of said support portions, each of said retention mechanism including a projection, on a first side, latchable engagement within the latching opening for restraining a vertical movement of the retention mechanism with regard to the bracket, an elongated vertical groove in a second side opposite to said first side, and a pair of ears respectively positioned on a third side and a fourth side opposite to said third side, each of said ears receivably engaged within the corresponding elongate notch for restraining a horizontal movement of the retention mechanism with regard to the bracket along a longitudinal direction of said bracket.

11. The retention module as claimed in claim 10, wherein each of said ears further includes a gripping portion extending from the corresponding linking portion and exposed outside the corresponding retention wall of said support portion.

* * * * *